United States Patent [19]

Bennett et al.

[11] Patent Number: 5,045,964

[45] Date of Patent: Sep. 3, 1991

[54] THERMAL CLAMP FOR AN IGNITION COIL DRIVER

[75] Inventors: Paul T. Bennett, Phoenix; Dunn William C., Mesa, both of Ariz.

[73] Assignee: Motorola, Inc., Schaumburg, Ill.

[21] Appl. No.: 516,952

[22] Filed: Apr. 30, 1990

[51] Int. Cl.$^5$ .......................................... F02P 11/00
[52] U.S. Cl. .................... 361/254; 361/103; 123/644
[58] Field of Search ................... 307/10.6; 361/25, 27, 361/37, 103, 106, 154, 254, 247, 253; 123/425, 490, 494, 623, 644

[56] References Cited

U.S. PATENT DOCUMENTS

| | | | |
|---|---|---|---|
| 4,281,358 | 7/1981 | Plouff et al. | 361/106 |
| 4,358,812 | 11/1982 | LoCascio et al. | 361/152 |
| 4,359,652 | 11/1982 | Jarrett et al. | 307/350 |
| 4,454,560 | 6/1984 | Nakao et al. | 307/10.6 |
| 4,854,292 | 8/1989 | Urushiwara et al. | 123/644 |
| 4,915,072 | 4/1990 | Caron et al. | 123/494 |
| 4,947,821 | 8/1990 | Somiya | 123/644 |

*Primary Examiner*—A. D. Pellinen
*Assistant Examiner*—Richard Elms
*Attorney, Agent, or Firm*—Bradley J. Botsch

[57] ABSTRACT

A circuit in an ignition system having a switchable current drive circuit responsive to a first control signal, and a charging circuit responsive to the switchable current drive circuit for providing a current through a coil to charge the coil when the switchable current drive circuit is enabled by the first control signal being in a first logic state and for collapsing the current through the coil thereby producing a rising voltage across the coil to fire a spark plug, typically coupled across the coil, when the switchable current drive circuit is disabled by the first control signal being in a second logic state. The circuit includes a thermal clamping circuit responsive to a second control signal and coupled to the charging circuit for providing current to the charging circuit to slowly discharge the coil and for clamping the voltage at the coil to a predetermined voltage such that the firing of the spark plug is prevented. The thermal clamping circuit is activated when the temperature of the ignition system exceeds a predetermined temperature.

14 Claims, 2 Drawing Sheets

THERMAL CLAMP FOR AN IGNITION COIL DRIVER

BACKGROUND OF THE INVENTION

This invention relates to ignition systems and, more particularly, to thermal clamping a coil for an ignition system.

The charging of a coil followed by a collapse of current through that coil typically produces a large voltage across the coil which can be used to fire a spark plug in an ignition system as is well known in the art. However, conditions such as the ignition system becoming too hot may occur requiring the ignition system to be protected by, for example, preventing the firing of the spark plug. Given this scenario, if the coil in the ignition system is charged, it is typically desired to slowly discharge the energy in the coil to prevent the firing of the spark plug. Also, if the voltage at the coil to a predetermined voltage so as to prevent the firing of the spark plug. Furthermore, if the coil is discharged and the ignition system is still hot, it is typically desired not to recharge the coil.

One attempt that prior art has made for protecting ignition coil drivers is disclosed in U.S. Pat. No. 4,359,652 by Jarrett et al and assigned to Motorola Inc. which describes an overvoltage detection circuit which teaches the protection against high voltage conditions occurring at a battery supply terminal. However, Jarrett does not teach any means to slowly discharge an ignition coil when the overvoltage condition occurs nor does it teach the prevention of recharging an ignition coil if the ignition system is still hot.

Another attempt that prior has made for protecting ignition coil drivers is disclosed in U.S. Pat. No. 4,358,812 by LoCascio et al and also assigned to Motorola Inc. which teaches how to switch the output current through an inductive load to a predetermined constant value when a predetermined peak magnitude of load current is reached. However, LoCascio also does not teach any means to slowly discharge the inductive load to prevent the firing of a spark plug, nor does it teach the prevention of recharging an ignition coil if the ignition system is still hot.

Hence, a need exists to provide a circuit for slowly discharging a coil in an ignition system to abate the firing of a spark plug and to prevent the recharging of the coil when the ignition system is still hot.

SUMMARY OF THE INVENTION

Accordingly, it is an object of the present invention to provide a thermal clamp for an ignition coil driver.

Another object of the present invention is to provide a circuit for slowly discharging the current through an ignition coil to prevent firing of a spark plug.

Still another object of the present invention is to provide a circuit for slowly discharging the current through an ignition coil to prevent firing of a spark plug in response to an external signal.

Yet another object of the present invention is to prevent the charging of a coil in an ignition system when the ignition system is in thermal limit.

In carrying out the above and other objects of the present invention, there is provided a circuit for driving an inductive load comprising a charging circuit for providing current through the load when enabled and for inhibiting current through the load when disabled; a control circuit being responsive to a first input logic signal for providing a first output logic signal for enabling and disabling the charging circuit when the first output logic signal respectively is in a first and second logic state, the control circuit being responsive to a second input logic signal for both providing a second output logic signal and causing the first output logic signal to be in the second logic state; and a thermal clamping circuit responsive to the second output logic signal and being coupled between the load and the charging circuit for providing current to the charging circuit and enabling the charging circuit to both slowly discharge the load and clamp the voltage across the load to a predetermined voltage.

The above and other objects, features and advantages of the present invention will be better understood from the following detailed description taken in conjunction with the accompanying drawings.

DETAILED DESCRIPTION OF THE PREFERRED EMBODIMENT

Figure 1:
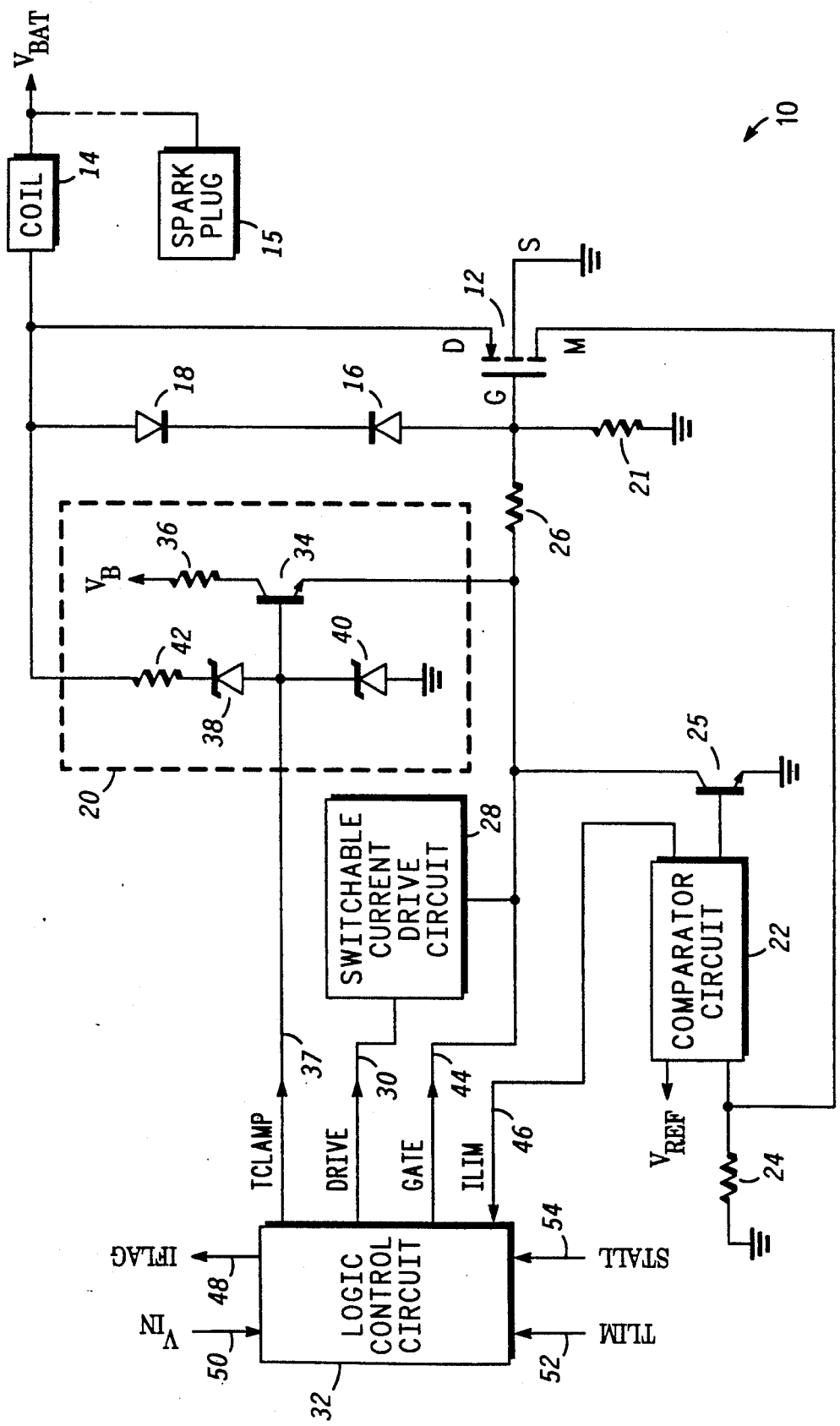
FIG. 1 is a partial schematic and block diagram illustrating the preferred embodiment of the present invention.

Referring to FIG. 1, a partial schematic and block diagram of the circuit of the preferred embodiment 10, which is suitable for integration on a single chip, is shown comprising insulated-gate bipolar transistor (IGBT) 12 having a drain coupled to coil 14, as is understood. The drain of IGBT 12 is further coupled to the gate of IGBT 12 by the series combination of diodes 16 and 18, and to thermal clamping circuit 20. The gate of IGBT 12 is returned to ground by resistor 21 while the source of IGBT 12 is also returned to ground. The mirror of IGBT 12 is coupled to a first input of comparator circuit 22 and returned to ground by resistor 24. It is well known in the art that the current flowing through the mirror of an IGBT represents a sampled version of the drain current of the IGBT and, thus, the mirror current is directly proportional to the drain current for an IGBT. The second input of comparator circuit 22 is coupled to a voltage supply at which the operating potential $V_{REF}$ is applied while the first output of comparator circuit 22 is coupled to the base of transistor 25 and the second output of comparator circuit 22 is coupled to a first input of logic control circuit 32 which supplies signal ILIM 46 thereto. Transistor 25 has an emitter returned to ground and a collector coupled to the gate of IGBT 12 by resistor 26. Switchable current drive circuit 28 has an input coupled to a first output of logic control circuit 32 which provides signal DRIVE 30 thereto, and an output coupled to the gate of IGBT 12 by resistor 26.

Thermal clamping circuit 20 includes transistor 34 having a collector coupled to a voltage supply via resistor 36 at which the operating potential $V_B$ is applied, an emitter coupled to the gate of IGBT 12 by resistor 26, and a base coupled to a second output of logic control circuit 32 which provides signal TCLAMP 37 thereto. The base of transistor 34 is further coupled to an anode of diode 38 and to a cathode of diode 40, the latter having an anode returned to ground. The cathode of diode 38 is coupled to the drain of IGBT 12 by resistor 42.

Logic control circuit 32 further includes a third output coupled by resistor 26 to the gate of IGBT 12 for providing control signal GATE 44 thereto, a fourth output for providing control signal IFLAG 48, and second, third and fourth inputs for receiving control signals $V_{IN}$, 50, TLIM, 52, and STALL, 54, respectively. It is worth noting that control signals $V_{IN}$, TLIM, STALL are typically supplied from a microprocessor or controller (not shown) and control signal IFLAG is typically provided to a microprocessor or controller (not shown).

Figure 2:
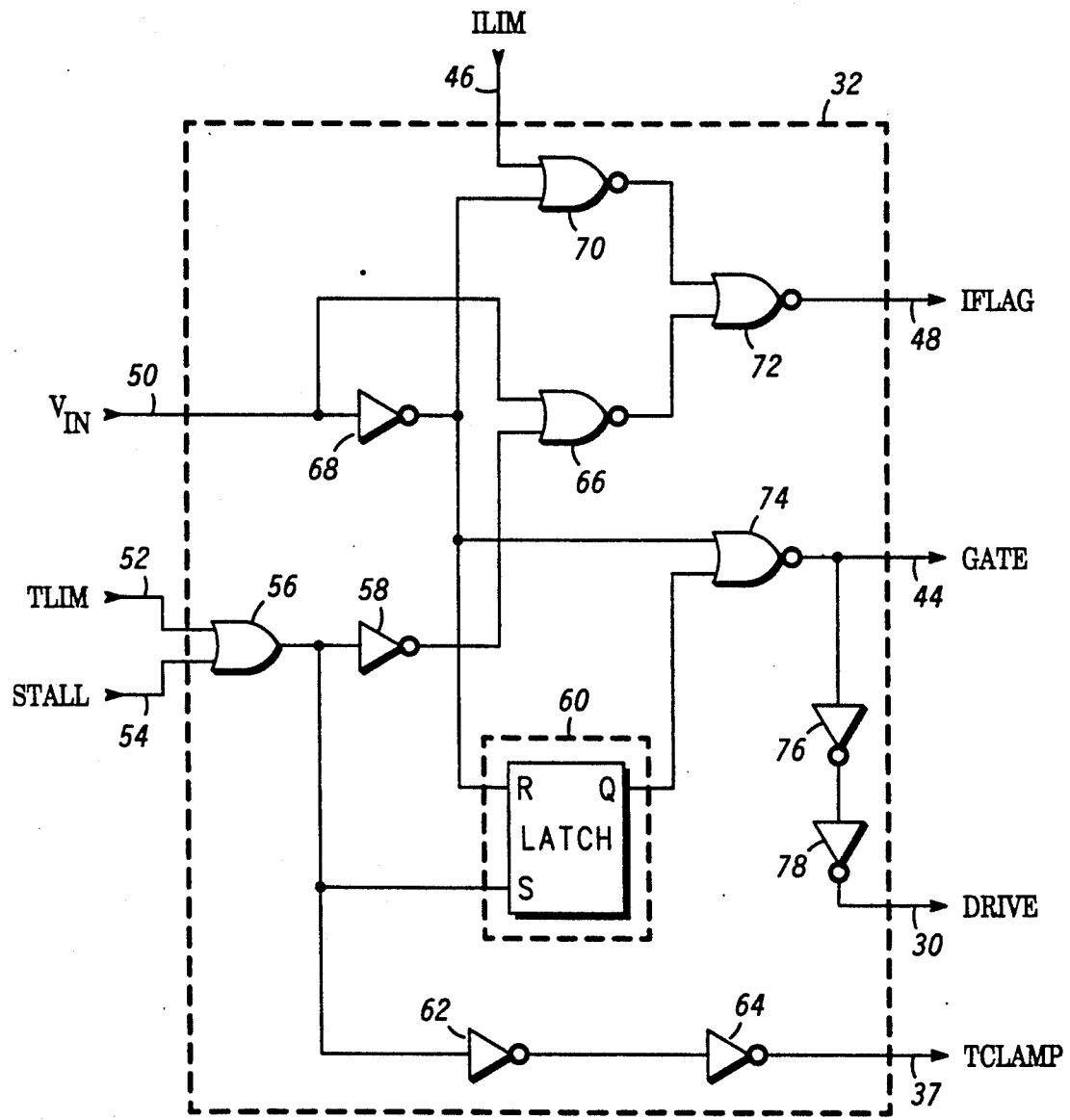
FIG. 2 is a detailed schematic diagram illustrating one implementation for a block shown in FIG. 1.

Referring to FIG. 2, a detailed schematic diagram of one implementation of logic control circuit 32 is shown, it is understood that components similar to those of FIG. 1 are designated by the same reference numerals. It is further understood that logic control circuit 32 may be realized in any number of ways and that FIG. 2 reveals only one implementation. The circuit of FIG. 2 comprises OR gate 56 having a first input coupled to signal TLIM 52, a second input coupled to signal STALL 54, and an output coupled to an input of inverter 58. The output of OR gate 56 is also coupled to a first input of latch 60 and to an input of inverter 62. The output of inverter 62 is coupled to an input of inverter 64, the latter having an output for providing signal TCLAMP 37. The output of inverter 58 is coupled to a first input of NOR gate 66, the latter having a second input coupled to signal $V_{IN}$ 50. Inverter 68 has an input also coupled to signal $V_{IN}$ 50 and an output coupled to a second input of latch 60 and to a first input of NOR gate 70. The second input of NOR gate 70 is coupled to signal ILIM 46. The outputs of NOR gates 66 and 70 are coupled to first and second inputs of NOR gate 72, respectively, while the output of NOR gate 72 provides signal IFLAG 48. The outputs of inverter 68 and latch 60 are coupled to first and second inputs of NOR gate 74, respectively, while the output of NOR gate 74 provides both signal DRIVE 30, via inverters 76 and 78, and signal GATE 44.

In normal operation, signals TLIM and STALL are at a logic low which, in turn, forces signal TCLAMP to a logic low thereby turning off thermal clamping circuit 20 while output Q of latch 60 is also a logic low. Therefore, when signal $V_{IN}$ goes to a logic high, signals GATE and DRIVE also go to a logic high. Furthermore, when signal DRIVE is a logic high, switchable current drive circuit 28 is enabled and supplies a predetermined current to the gate of IGBT 12. Also, when signal GATE is a logic high, an additional predetermined current is supplied to the gate of IGBT 12 via signal GATE. Therefore, the currents supplied from switchable current drive circuit 28 and signal GATE develop a voltage across resistor 21 thereby turning on IGBT 12. IGBT 12 functions as a charging circuit and allows coil 14 to charge via the current through IGBT 12 as is understood in the art. On the other hand, when signal $V_{IN}$ goes to a logic low, signals GATE and DRIVE also go to a logic low thereby turning off all gate drive to IGBT 12 which turns off IGBT 12 and allows the voltage on coil 14 to rise quickly as it is discharged in order to fire spark plug 15 as is further understood. Also, diodes 16 and 18 function to clamp the voltage across the gate and drain of IGBT 12 to a magnitude of approximately 400 volts thereby clamping the voltage across coil 14.

Furthermore, a voltage is developed across resistor 24 that is directly proportional to the current flowing through the mirror of IGBT 12 such that comparator 22 compares the voltage across resistor 24 to a reference voltage, $V_{REF}$, in order to clamp the current in coil 14 to a predetermined current of approximately 6 amps. Therefore, as the current through coil 14 exceeds a predetermined current, the voltage across resistor 24 exceeds a predetermined voltage and, thus, the first and second outputs of comparator 22 switch to a logic high. Furthermore, a logic high occurring at the first output of comparator 22 turns on transistor 25 which sinks current from the third output of logic control circuit 32. This results in steering current away from the gate of IGBT 12 and steering that current through transistor 25 thereby clamping the voltage at the gate of IGBT 12 so as to clamp the current through coil 14 to a predetermined current. It is this feedback loop that limits the voltage on the gate of IGBT 12 to a predetermined voltage such that a maximum of approximately 6 amps flows through coil 14. The second output of comparator circuit 22 provides the signal ILIM to logic control circuit 32 when the second output of comparator 22 is a logic high. The above described normal operation of charging and discharging a coil to fire a spark plug is well known in the art as is understood.

However, under certain conditions such as high temperature, the normal operation of firing a spark plug is desired to be discontinued in order to prevent possible ignition system and engine damage. Therefore, when normal operation is discontinued, the following protective functions should be provided. First, if coil 14 is charged, it must be discharged slowly enough to prevent the energy in the coil from firing spark plug 15. Second, if the voltage on coil 14 is allowed to rise, the voltage must be clamped to a predetermined voltage to prevent the firing of spark plug 15. Third, if coil 14 is discharged and the ignition system is still too hot, coil 14 must not be allowed to recharge. Preferred embodiment 10 performs all three of the above described protective functions plus an additional function of allowing external signal STALL 54 of logic control circuit 32 to be utilized to slowly discharge coil 14. All of the four above functions will be further discussed below.

Signal TLIM is the "thermal limit" signal such that when TLIM is a logic low, the ignition system is not in thermal limit. However, when TLIM is a logic high, the ignition system is in thermal limit and the ignition system is too hot to operate normally. It should be understood that TLIM is a signal provided by a thermal limit detector (not shown) that senses when the operating temperature of the system exceeds a predetermined temperature as is well known in the art. Therefore, when TLIM goes to a logic high, signal TCLAMP goes to a logic high which turns on and activates thermal clamping circuit 20 thereby turning on transistor 34. Furthermore, when signal TLIM is a logic high, latch 60 is set which forces signals GATE and DRIVE to a logic low. Therefore, all of the gate drive to IGBT 12 is removed and, thus, IGBT 12 is turned off. This allows the gate voltage of IGBT 12 to decay slowly as determined by the values of resistor 21 and the internal gate-source capacitance of IGBT 12, $C_{GS}$. However, due to the abrupt switching characteristics of IGBT 12, the voltage on the drain (and coil 14) can still increase rapidly. Therefore, thermal clamping circuit 20 is needed to clamp the voltage at the drain of IGBT 12 to a predetermined voltage level of approximately 40 volts in order to prevent firing of spark plug 15 as is accomplished by diodes 38 and 40 and resistor 42. Furthermore, since transistor 34 is on, thermal clamping circuit 20 slowly discharges coil 14 by providing a current to the gate of IGBT 12 which turns IGBT 12 back on again and allows coil 14 to charge thereby preventing a collapse of current through coil 14. Therefore, thermal clamping circuit 20 provides two functions when activated: it provides additional gate current to IGBT 12 via transistor 34, to turn back on IGBT 12 such that a slow discharge of coil 14 is achieved, and it clamps the drain voltage of IGBT 12 to a predetermined voltage, which is a function of resistor 42 and diodes 38 and 40, where both functions prevent the firing of spark plug 15. Thus, thermal clamping circuit 20 provides the first and second aforedescribed protective functions. Furthermore, if an external signal, STALL, goes to a logic high, the same aforedescribed functions will result as when signal TLIM went to a logic high. Therefore, external signal STALL can be utilized to turn on thermal clamping circuit 20 for other than a thermal limit condition and, thus, to slowly discharge coil 14 and to clamp the drain voltage of IGBT 12 to a predetermined voltage.

The third aforedescribed protective function is provided primarily through latch 60 as shown in FIG. 2. Briefly, if signal TLIM is a logic high, which means the system is in thermal limit, the output of latch 60 is set which as aforementioned, forces signals GATE and DRIVE to a logic low and prevents any further firing of spark plug 15. Therefore, if signal $V_{IN}$ goes high in an attempt to charge coil 14, signals GATE and DRIVE will remain low since latch 60 is set, thereby preventing the recharging of coil 14. Furthermore, $V_{IN}$ must go to a logic low which resets latch 60 in order to allow recharging of coil 14, provided that both signals TLIM and STALL are a logic low. Therefore, latch 60 will not allow coil 14 to recharge if the system is too hot, that is, TLIM is at a logic high and/or external signal STALL is at a logic high.

By now it should be apparent from the foregoing discussion that there has been provided a novel circuit for slowly discharging the coil of an ignition system and for clamping the voltage at the coil to avoid the firing of a spark plug whenever the ignition system is in a thermal limit condition or in response to an external signal.

We claim:

1. A circuit for driving an inductive load coupled thereto, comprising:
charging means for providing current through the inductive load when enabled and for inhibiting current through the inductive load when disabled;
a control circuit being responsive to a first input logic signal for providing a first output logic signal for enabling and disabling said charging means when said first output logic signal respectively is in a first and second logic state, said control circuit being responsive to a second input logic signal for both providing a second output logic signal and causing said first output logic signal to be in said second logic state; and
thermal clamping means responsive to said second output logic signal and being coupled between the inductive load and said charging means for providing current to said charging means thereby enabling said charging means to both discharge the inductive load at a predetermined rate and clamp the voltage across the inductive load to a predetermined voltage wherein a collapse of current through the inductive load is prevented.

2. The circuit according to claim 1 wherein said control circuit includes:
a logic circuit being responsive to said first and second input logic signals for providing third and fourth output logic signals; and
a switchable current drive circuit being responsive to said third output logic signal for providing an output signal, said output signal of said switchable current drive circuit and said fourth output logic signal comprising said first output logic signal of said control circuit.

3. The circuit according to claim 2 wherein said logic circuit includes:
first gate means being responsive to said first input logic signal for providing an output;
second gate means being responsive to said second input logic signal and having an output for providing said second output logic signal;
a latch circuit having a first input coupled to said output of said first gate means, a second input coupled to said second gate means, and an output; and
third gate means having first and second inputs coupled respectively to said output of said first gate means and said output of said latch circuit and having an output for providing said third and fourth output signals of said logic circuit.

4. The circuit according to claim 3 further including:
a current limit circuit coupled to said charging means and responsive to said current through the inductive load reaching a predetermined magnitude for steering current from said charging means such that the current through the load is clamped to said predetermined magnitude.

5. The circuit according to claim 1 wherein said charging means includes:
an insulated-gate bipolar transistor having a drain coupled to the inductive load and to said thermal clamping means, a gate coupled to said thermal clamping means and to said control circuit, and a source coupled to a first supply voltage terminal.

6. The circuit according to claim 1 wherein said thermal clamping means includes:
a transistor having a collector coupled to a first supply voltage terminal, a base coupled to said charging means by a first diode, to a first supply voltage terminal by a second diode, and to said control circuit, and an emitter coupled to said charging means.

7. In an integrated chip, an ignition coil driver circuit for driving an inductive load coupled thereto, comprising:
charging means for providing current through the inductive load when enabled and for inhibiting current through the inductive load when disabled;
a control circuit being responsive to a first input logic signal for providing a first output logic signal for enabling and disabling said charging means when said first output logic signal respectively is in a first and second logic state, said control circuit being responsive to a second input logic signal for both providing a second output logic signal and causing said first output logic signal to be in said second logic state; and
thermal clamping means responsive to said second output logic signal and being coupled between the inductive load and said charging means for providing current to said charging means thereby enabling said charging means to both discharge the inductive load at a predetermined rate and clamp the voltage across the inductive load to a predetermined voltage wherein a collapse of current through the inductive load is prevented.

8. The ignition coil driver circuit according to claim 7 wherein said control circuit includes:
 a logic circuit being responsive to said first and second input logic signals for providing third and fourth output logic signals; and
 a switchable current drive circuit being responsive to said third output logic signal for providing an output signal, said output signal of said switchable current drive circuit and said fourth output logic signal comprising said first output logic signal of said control circuit.

9. The ignition coil driver circuit according to claim 8 wherein said logic circuit includes:
 first gate means being responsive to said first input logic signal for providing an output;
 second gate means being responsive to said second input logic signal and having an output for providing said second output logic signal;
 a latch circuit having a first input coupled to said output of said first gate means, a second input coupled to said second gate means, and an output; and
 third gate means having first and second inputs coupled respectively to said output of said first gate means and said output of said latch circuit and having an output for providing said third and fourth output signals of said logic circuit.

10. The ignition coil driver circuit according to claim 9 further including:
 a current limit circuit coupled to said charging means and responsive to said current through the inductive load reaching a predetermined magnitude for steering current from said charging means such that the current through the inductive load is clamped to said predetermined magnitude.

11. The ignition coil driver circuit according to claim 10 wherein said charging means includes:
 an insulated-gate bipolar transistor having a drain coupled to the inductive load and to said thermal clamping means, a gate coupled to said thermal clamping means and to said control circuit, and a source coupled to a first supply voltage terminal.

12. The ignition coil driver circuit according to claim 11 wherein said thermal clamping means includes:
 a transistor having a collector coupled to a first supply voltage terminal, a base coupled to said charging means by a first diode, to a first supply voltage terminal by a second diode, and to said control circuit, and an emitter coupled to said charging means.

13. A method for thermally clamping an ignition coil driver system having switchable current drive means and charging means responsive to the switchable current drive means for charging and discharging an inductive load when the switchable current drive means is enabled and disabled, respectively, the method comprising the steps of:
 disabling the switchable current drive means when the temperature of the ignition coil driver system exceeds a predetermined temperature;
 sensing a voltage at the inductive load and providing a signal when said voltage at the inductive load exceeds a predetermined threshold; and
 applying said signal to the charging means for discharging the inductive load at a predetermined rate wherein a collapse of current through the inductive load is prevented.

14. The method according to claim 13 further including the step of:
 maintaining the switchable current drive means disabled when said temperature of the ignition coil driver system exceeds said predetermined temperature.

* * * * *